(12) United States Patent
Hayakawa

(10) Patent No.: US 11,770,153 B2
(45) Date of Patent: *Sep. 26, 2023

(54) RADIO-FREQUENCY MODULE

(71) Applicant: Murata Manufacturing Co., Ltd., Nagaokakyo (JP)

(72) Inventor: Masashi Hayakawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/501,002

(22) Filed: Oct. 14, 2021

(65) Prior Publication Data

US 2022/0038131 A1 Feb. 3, 2022

Related U.S. Application Data

(63) Continuation of application No. 16/838,107, filed on Apr. 2, 2020, now Pat. No. 11,177,850, which is a continuation of application No. 15/229,285, filed on Aug. 5, 2016, now Pat. No. 10,651,884.

(51) Int. Cl.
*H04B 1/44* (2006.01)
*H03K 17/693* (2006.01)

(52) U.S. Cl.
CPC .............. *H04B 1/44* (2013.01); *H03K 17/693* (2013.01); *H01L 2224/16225* (2013.01)

(58) Field of Classification Search
CPC ........................................................ H04B 1/44
See application file for complete search history.

(56) References Cited

U.S. PATENT DOCUMENTS

| | | | | |
|---|---|---|---|---|
| 2002/0118044 A1* | 8/2002 | Hirai | ............. | H03K 17/693 |
| | | | | 257/E27.012 |
| 2002/0166689 A1* | 11/2002 | Maetani | ............. | H05K 1/0243 |
| | | | | 174/541 |
| 2011/0007675 A1* | 1/2011 | Chiou | ............. | H04B 1/44 |
| | | | | 455/73 |
| 2012/0049945 A1* | 3/2012 | Meguro | ............. | H04B 1/48 |
| | | | | 327/558 |
| 2013/0176916 A1* | 7/2013 | Uejima | ............. | H04B 1/48 |
| | | | | 370/278 |
| 2015/0294805 A1* | 10/2015 | Hayward | ............. | C23C 14/30 |
| | | | | 200/511 |

OTHER PUBLICATIONS

Hayakawa, "Radio-Frequency Module", U.S. Appl. No. 16/838,107, filed Apr. 2, 2020.

* cited by examiner

*Primary Examiner* — Hsinchun Liao
(74) *Attorney, Agent, or Firm* — KEATING & BENNETT, LLP

(57) ABSTRACT

A radio-frequency module includes a substrate and a switch IC mounted on the substrate and including a common terminal and a plurality of selection terminals. The substrate includes ground electrodes disposed between the common terminal and the plurality of selection terminals in a plan view of the substrate.

19 Claims, 8 Drawing Sheets

RADIO-FREQUENCY MODULE

CROSS REFERENCE TO RELATED APPLICATIONS

This application claims the benefit of priority to Japanese Patent Application 2015-158474 filed Aug. 10, 2015, the entire contents of which application are hereby incorporated herein by reference.

BACKGROUND OF THE INVENTION

1. Field of the Invention

The present invention relates to a radio-frequency module including a switch integrated circuit (IC) to switch between paths for a radio-frequency signal.

2. Description of the Related Art

In a front-end portion of a wireless communication terminal such as a cellular phone, a switch IC to switch between paths for a radio-frequency signal is used (see, for example, Japanese Unexamined Patent Application Publication No. 2011-010185).

The switch IC used in a wireless receiver disclosed in Japanese Unexamined Patent Application Publication No. 2011-010185 includes one common terminal and plural selection terminals. A test signal generator is connected to the common terminal of the switch IC. In this wireless receiver, by connecting one of the plural selection terminals and the common terminal with each other, a test signal can be transmitted to the selection terminal connected to the common terminal.

There is a growing demand for reducing the size of a wireless communication terminal including a wireless receiver, such as that disclosed in Japanese Unexamined Patent Application Publication No. 2011-010185. In accordance with this demand, the size of the switch IC is also being reduced.

As described above, the switch IC is used to switch between paths for a radio-frequency signal. For the use of the switch IC in a wireless communication terminal, a leakage of a signal occurs from between the common terminal and a selection terminal which is not connected to the common terminal. That is, the isolation between the selection terminals and the common terminal is not sufficient. The leakage of a signal becomes more noticeable as the size of the switch IC is smaller.

SUMMARY OF THE INVENTION

Accordingly, preferred embodiments of the present invention enhance isolation between a common terminal and selection terminals of a switch IC included in a radio-frequency module.

According to a preferred embodiment of the present invention, a radio-frequency module includes a substrate and a switch IC. The switch IC is mounted on the substrate and includes a common terminal and a plurality of selection terminals. The substrate includes a ground electrode to be grounded. The ground electrode is disposed between the common terminal and the plurality of selection terminals in a plan view of the substrate.

With this configuration, at least a portion of radio-frequency waves propagating between the common terminal and the plurality of selection terminals of the switch IC is able to be blocked. That is, it is possible to enhance the isolation between the common terminal and the plurality of selection terminals of the switch IC.

At least a portion of the ground electrode may be disposed within the substrate.

With this configuration, the ground electrode is able to block at least a portion of radio-frequency waves propagating within the substrate.

At least a portion of the ground electrode may extend in a thickness direction of the substrate.

With this configuration, radio-frequency waves propagating within the substrate are able to be blocked more reliably by the ground electrode.

The ground electrode may include a via-electrode extending in a thickness direction of the substrate.

The ground electrode may include a plurality of via-electrodes. The plurality of via-electrodes are aligned along the plurality of selection terminals in a plan view of the substrate.

In this manner, the plurality of via-electrodes preferably have a columnar or substantially columnar shape are aligned between the common terminal and the selection terminals. In other words, the plurality of via-electrodes define a plane on which radio-frequency waves are able to be blocked. This makes it possible to more reliably block radio-frequency waves propagating between the common terminal and the selection terminals.

The ground electrode may include a wiring pattern which connects at least two of the plurality of via-electrodes.

The ground electrode is an electrode including a wiring pattern extending in a direction parallel or substantially parallel with the main surface of the substrate. Accordingly, the ground electrode contributes to blocking radio-frequency waves propagating within a portion of the substrate located between the plurality of via-electrodes extending in the thickness direction of the substrate.

The substrate may be a multilayer substrate including a plurality of layers stacked on each other. The via-electrode may pass through at least one of the plurality of layers.

The ground electrode may not be exposed to the outside at a main surface of the substrate on which the switch IC is mounted.

With this configuration, it is possible to prevent the occurrence of short-circuiting on the main surface on which the switch IC is mounted between the ground electrode and the common terminal and the selection terminals of the switch IC. Additionally, since the ground electrode is not exposed to the outside at this main surface, the diameter of the ground electrode, for example, may be set to be equal or substantially equal to or greater than the distance between the common terminal and the selection terminals. That is, the flexibility in choosing the size of the ground electrode is improved.

The radio-frequency module may further include a directional coupler. At least one of the plurality of selection terminals may be connected to a coupled port of the directional coupler.

If at least one of the selection terminals is connected to the corresponding coupled port of the directional coupler, a radio-frequency signal input into each of the selection terminals is weaker than that propagating between two input/output ports of the directional coupler. However, in the radio-frequency module according to a preferred embodiment of the present invention, the isolation between the common terminal and the selection terminals of the switch IC is enhanced. As a result, a weak radio-frequency signal is able to be output from the common terminal at a high signal-to-noise (S/N) ratio.

One of the plurality of selection terminals may be connected to one coupled port of the directional coupler, and another one of the plurality of selection terminals may be connected to another coupled port of the directional coupler.

In this manner, if both of the coupled ports are connected to the selection terminals, it is not possible to terminate the coupled ports, which makes it difficult to reduce or prevent the radiation of radio-frequency waves from the coupled ports. However, in the radio-frequency module according to a preferred embodiment of the present invention, even in such a case, the ground electrode is able to block radio-frequency waves radiated from the coupled port connected to the selection terminal which is not connected to the common terminal. As a result, a weak radio-frequency signal from the directional coupler is able to be output from the common terminal at a high S/N ratio.

By the ground electrode, a region at a corner of the substrate where the common terminal is disposed may be separated from a region of the substrate where the plurality of selection terminals and the directional coupler are disposed, in a plan view of the substrate.

With this configuration, even in a case in which a radio-frequency device that radiates radio-frequency waves other than the directional coupler is disposed around the region where the common terminal is disposed, the propagation of the radio-frequency waves to this region is able to be blocked by the ground electrode, thus significantly reducing or preventing the occurrence of radio-frequency noise in this region. As a result, it is possible to significantly reduce or prevent a decrease in the S/N ratio of a radio-frequency signal output from the common terminal.

The region where the common terminal is disposed is located at a corner of the substrate. This makes it possible to facilitate inputting of a radio-frequency signal output from the common terminal into a detector located outside the substrate. It is also possible to decrease the number of via-electrodes forming the ground electrode that are necessary to separate the regions from each other, which also makes it possible to reduce the area where the via-electrodes are disposed.

In a radio-frequency module according to a preferred embodiment of the present invention, it is possible to enhance the isolation between a common terminal and selection terminals of a switch IC included in the radio-frequency module.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
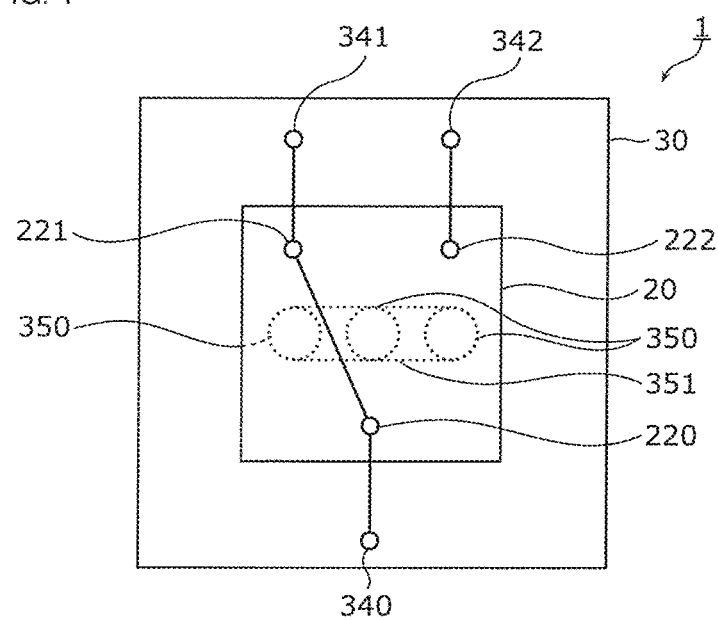
FIG. 1 is a circuit diagram illustrating the circuit configuration of a radio-frequency module according to a first preferred embodiment of the present invention.

Preferred embodiments of the present invention will be described below in detail with reference to the accompanying drawings. All of the preferred embodiments described below illustrate general or specific examples. Numeric values, configurations, materials, components, and positions and connection states thereof illustrated in the following preferred embodiments are only examples, and are not described for limiting the present invention. Among the components illustrated in the following preferred embodiments, the components that are not recited in the independent claims which embody the broadest concept of the present invention will be described as optional components. The sizes and dimensional ratios of the components in the drawings are not necessarily illustrated as actual sizes and ratios.

First Preferred Embodiment

The overall configuration of a radio-frequency module according to a first preferred embodiment of the present invention will first be described below with reference to the drawings.

FIG. 1 is a circuit diagram illustrating the circuit configuration of the radio-frequency module 1.

Figure 2:
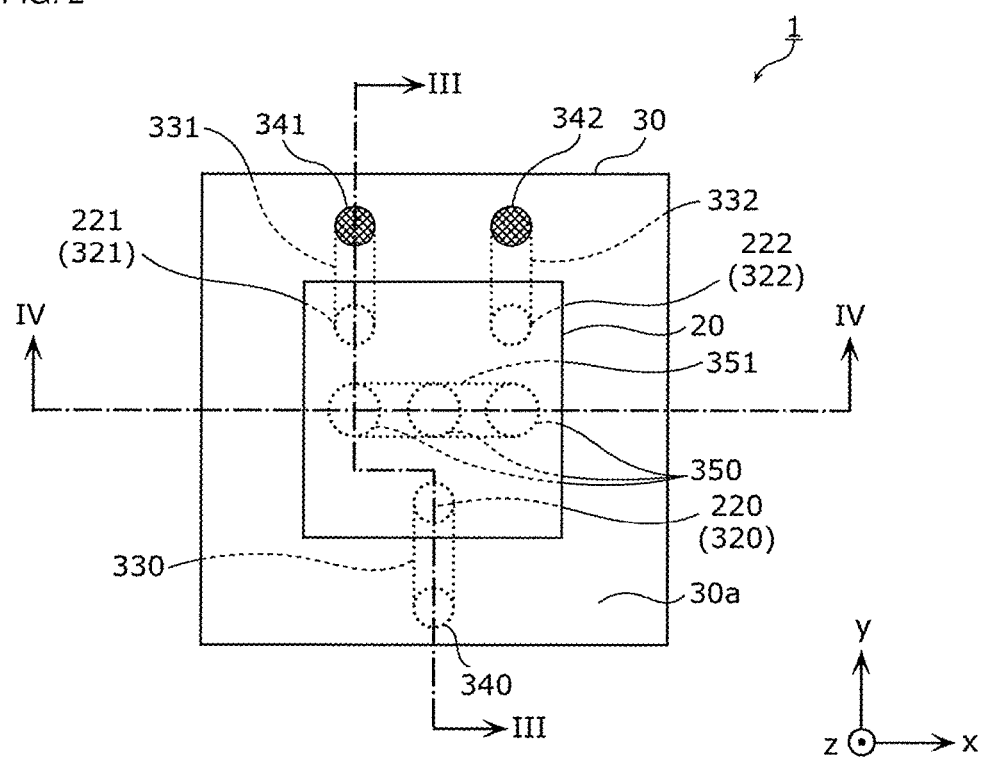
FIG. 2 is a top view illustrating the external appearance of the radio-frequency module according to the first preferred embodiment of the present invention.

FIG. 2 is a top view illustrating the external appearance of the radio-frequency module 1.

Figure 3:
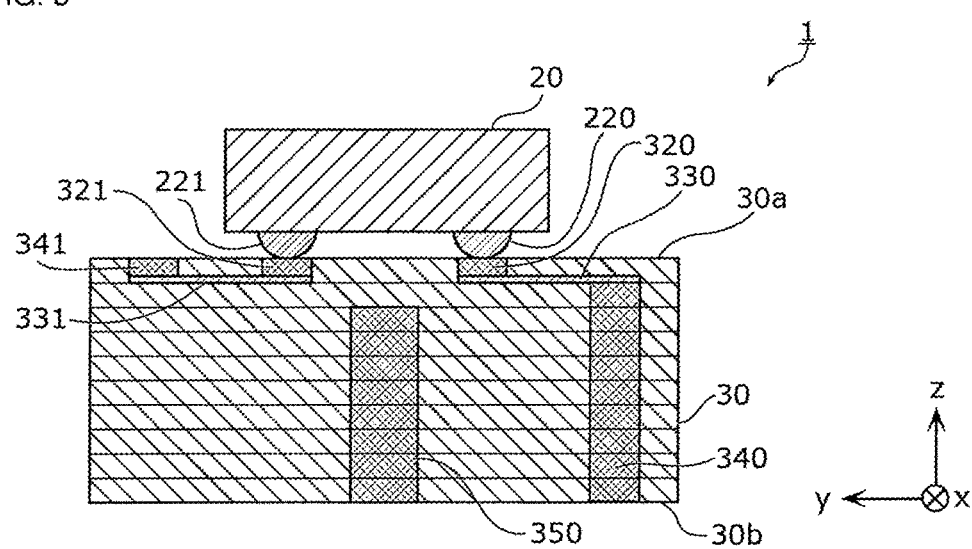
FIG. 3 is a sectional view illustrating the structure of the radio-frequency module taken along line III-III of FIG. 2.

FIG. 3 is a sectional view illustrating the structure of the radio-frequency module 1 taken along line III-III of FIG. 2.

Figure 4:
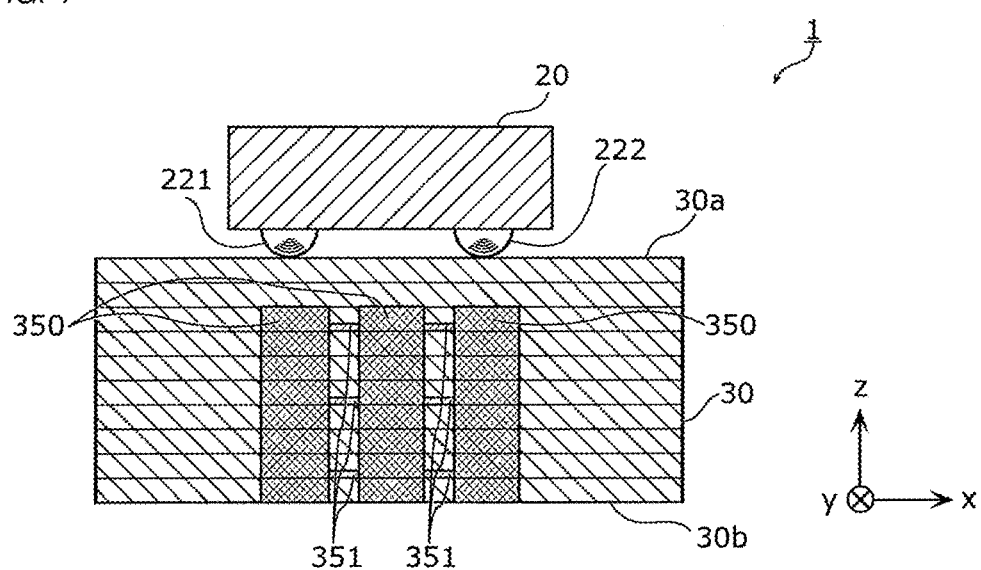
FIG. 4 is a sectional view illustrating the structure of the radio-frequency module taken along line IV-IV of FIG. 2.

FIG. 4 is a sectional view illustrating the structure of the radio-frequency module 1 taken along line IV-IV of FIG. 2.

As shown in FIG. 1, the radio-frequency module 1 includes a substrate 30 and a switch IC 20. The switch IC 20 is mounted on the substrate 30 and includes a common terminal 220 and plural selection terminals 221 and 222. The switch IC 20 and the substrate 30 will be discussed below in detail.

As shown in FIG. 1, the switch IC 20 is a switch circuit which selectively connects the common terminal 220 and one of the selection terminals 221 and 222 with each other. The switch IC 20 is a known switch circuit which is implemented by a transistor such as a field-effect transistor (FET), and selectively connects one of the selection terminals 221 and 222 and the common terminal 220 with each other, based on a signal to drive the switch IC 20.

In the first preferred embodiment, the switch IC 20 is a packaged circuit component preferably with a rectangular or substantially rectangular parallelepiped shape. The common terminal 220 (see FIG. 3) and the selection terminals 221 and 222 (see FIG. 4) of the switch IC 20 are disposed on the outer surface of the switch IC 20 which opposes the substrate 30.

The selection terminals 221 and 222 are disposed in the x-axis direction shown in FIG. 2. The common terminal 220 is disposed in a direction intersecting with the direction (the x-axis direction in FIG. 2) in which the selection terminals 221 and 222 are disposed. That is, the common terminal 220 is disposed in the y-axis direction in FIG. 2, and is located at a position separated from the selection terminals 221 and 222.

The distance between the common terminal 220 and each of the selection terminals 221 and 222 of the switch IC 20 (the distance in the y-axis direction in FIG. 2) is not particularly restricted. In the first preferred embodiment, the distance preferably is about 50 μm to about 150 μm, for example. In a switch for a radio-frequency signal, as the distance between the common terminal 220 and each of the selection terminals 221 and 222 is smaller, it is more difficult to secure the isolation therebetween. Accordingly, if this distance is small, such as that in the switch IC 20 in the first preferred embodiment, it is necessary to take certain measures to secure the isolation between the common terminal 220 and each of the selection terminals 221 and 222.

As shown in FIGS. 2 through 4, the switch IC 20 is mounted on a main surface 30a of the substrate 30 on the positive side in the z-axis direction. In the first preferred embodiment, the common terminal 220 and the selection terminals 221 and 222 each include a solder bump. As shown in FIG. 3, the solder bump of the common terminal 220 and that of the selection terminal 221 are respectively connected to connecting terminals 320 and 321 of the substrate 30. Similarly, the solder bump of the selection terminal 222 is connected to a connecting terminal 322, though it is not shown. The configuration of the connecting terminal 322 is similar to that of the connecting terminal 321 shown in FIG. 3.

The configurations of the common terminal 220 and the selection terminals 221 and 222 of the switch IC 20 are not restricted to the above-described configurations. For example, the common terminal 220 and the selection terminals 221 and 222 may be disposed on a side surface of the switch IC 20 (outer surface of the switch IC 20 perpendicular or substantially perpendicular to the main surface 30a of the substrate 30).

The substrate 30 is a substrate on which the switch IC 20 is mounted. In the first preferred embodiment, as shown in FIGS. 3 and 4, the substrate 30 is a multilayer substrate including plural layers stacked on each other. In the first preferred embodiment, the plural layers defining the substrate 30 are dielectric layers each having a thickness of about 10 μm to about 20 μm, for example. Wiring patterns made of a conductive member are disposed on the surfaces of at least some of the plural dielectric layers defining the substrate 30, and via-electrodes made of a conductive member pass through at least some of the dielectric layers. By using such wiring patterns and via-electrodes, the terminals are electrically connected to each other.

As shown in FIG. 2, on the main surface 30a of the substrate 30 on which the switch IC 20 is mounted, the connecting terminals 320, 321, and 322 are respectively located at positions at which the common terminal 220 and the selection terminals 221 and 222 of the switch IC 20 are located, as viewed from above. The connecting terminals 320, 321, and 322 are respectively connected to connecting terminals 340, 341, and 342 via wiring patterns 330, 331, and 332 disposed within the substrate 30. In the first preferred embodiment, the connecting terminals 320 through 322 and 340 through 342 are defined by via-electrodes.

The positions and configurations of the connecting terminals 340 through 342 are not particularly restricted. In the first preferred embodiment, as shown in FIG. 3, the connecting terminal 340 is defined by a via-electrode exposed to the outside at a main surface 30b. On the other hand, as shown in FIG. 3, the connecting terminal 341 is defined by a via-electrode exposed to the outside at the main surface 30a on which the switch IC 20 is mounted. The connecting terminal 342, as well as the connecting terminal 341, is defined by a via-electrode exposed to the outside at the main surface 30a, though it is not shown.

The connecting terminals 340 through 342 are used as input/output ports for the switch IC 20. For example, wirings and terminals connected to the elements defining a radio-frequency circuit are connected to the connecting terminals 340 through 342.

As shown in FIG. 2, the substrate 30 includes ground electrodes 350 and 351, which are electrodes to be grounded, located between the common terminal 220 and the selection terminals 221 and 222 of the switch IC 20 in a plan view of the substrate 30. By the provision of the ground electrodes 350 and 351, at least a portion of radio-frequency waves propagating between the common terminal 220 and the selection terminals 221 and 222 is able to be blocked. That is, it is possible to enhance the isolation between the common terminal 220 and the selection terminals 221 and 222 of the switch IC 20.

As in the radio-frequency module 1, if the connecting terminal 340, which is a conductive member, connected to the common terminal 220 of the switch IC 20 is exposed to the outside at the main surface 30b of the substrate 30, it means that a conductive member defining the connecting terminal 320, the wiring pattern 330, and the connecting terminal 340 extends from the main surface 30a to the main surface 30b. With this configuration, the conductive member is more likely to receive a radio-frequency signal propagating within the substrate 30. Accordingly, if the connecting terminal 340 is exposed to the outside at the main surface 30b, the effect of enhancing the isolation achieved by blocking radio-frequency waves propagating within the substrate 30 due to the provision of the ground electrodes 350 and 351 in the substrate 30 becomes more noticeable.

In the first preferred embodiment, at least some of the ground electrodes 350 and 351 are disposed within the substrate 30, thus making it possible to block at least a portion of radio-frequency waves propagating within the substrate 30.

Each of the plural ground electrodes 350 is a via-electrode passing through at least some of the dielectric layers of the substrate 30. In this manner, in the first preferred embodiment, at least some of the plural ground electrodes 350 are disposed within the substrate 30 in the thickness direction of the substrate 30 (the z-axis direction in FIGS. 3 and 4). That is, unlike the wiring patterns disposed along the surface of the dielectric layers defining the substrate 30, the ground electrodes 350 are disposed in the direction in which they pass through the dielectric layers. Accordingly, by the provision of the ground electrodes 350 extending in the thickness direction of the substrate 30, a radio-frequency signal propagating within the substrate 30 is able to be blocked more reliably.

In the first preferred embodiment, the plural ground electrodes 350 of the substrate 30 are aligned along the plural selection terminals 221 and 222 of the switch IC 20.

In this manner, the plural ground electrodes 350 with a columnar or substantially columnar shape are aligned between the common terminal 220 and the selection terminals 221 and 222. In other words, the plural ground electrodes 350 are provided on a plane on which radio-frequency waves are able to be blocked. This makes it possible to more reliably block radio-frequency waves propagating between the common terminal 220 and the selection terminals 221 and 222. The plural ground electrodes 350 may not necessarily be arranged in a straight line in a plan view of the substrate 30. Alternatively, the plural ground electrodes 350 may be arranged in a curved line in a plan view of the substrate 30.

In the first preferred embodiment, the ground electrodes 350 preferably are formed by disposing a via-electrode in each of the plural dielectric layers and then by stacking the dielectric layers on each other. However, the ground electrodes 350 may be formed in a different manner. For example, recessed portions or through-holes may be provided in the substrate 30, and then, conductive members may be inserted into the recessed portions or the through-holes, thus forming the ground electrodes 350.

The shape and the size of the ground electrodes 350 are not particularly restricted. In the first preferred embodiment, the ground electrodes 350 are formed in a cylindrical or substantially cylindrical shape having a diameter of about 100 μm, for example. Alternatively, the ground electrodes 350 may be a plate-shaped or substantially plate-shaped or rectangular or substantially rectangular parallelepiped-shaped.

In the first preferred embodiment, the ground electrodes 351 defined by wiring patterns which connect the plural ground electrodes 350 are also provided. The ground electrodes 351 are electrodes extending in a direction parallel or substantially parallel with the main surface 30a of the substrate 30. Accordingly, the ground electrodes 351 contribute to blocking radio-frequency waves propagating within a portion of the substrate located between the plural ground electrodes 350 extending in the thickness direction of the substrate 30.

The number of plural ground electrodes 350 and 351 are not particularly restricted. However, if many ground electrodes 350 and 351 are provided at small pitches, the effect of blocking radio-frequency waves is enhanced more effectively. For example, if the distance between adjacent ground electrodes 350 is set to be about ¼ or smaller of the wavelength of radio-frequency waves used in the radio-frequency module 1, the effect of blocking radio-frequency waves by the plural ground electrodes 350 is enhanced.

As shown in FIGS. 3 and 4, in the first preferred embodiment, the ground electrodes 350 and 351 are not exposed to the outside at the main surface 30a of the substrate 30 on which the switch IC 20 is mounted. With this configuration, it is possible to prevent the occurrence of short-circuiting on the main surface 30a between the ground electrodes 350 and 351 and the common terminal 220 and the selection terminals 221 and 222 of the switch IC 20. Additionally, since the ground electrodes 350 are not exposed to the outside at the main surface 30a, the diameter of the ground electrodes 350, for example, may be set to be equal or substantially equal to or greater than the distance between the common terminal 220 and the selection terminals 221 and 222. That is, the flexibility in choosing the sizes of the ground electrodes 350 and 351 is improved.

The configuration in which the ground electrodes 350 are grounded is not particularly restricted. For example, in the first preferred embodiment, the ground electrodes 350 are exposed to the outside at the main surface 30b of the substrate 30 in the negative side in the z-axis direction shown in FIGS. 2 through 4, and the exposed portions may be connected to external wirings or terminals which are grounded. In the first preferred embodiment, the ground electrodes 350 are connected to each other by using the ground electrodes 351, which are defined by wiring patterns provided on the dielectric layers of the substrate 30. Note that not all the ground electrodes 350 have to be exposed to the outside at the main surface 30b. For example, only some of the ground electrodes 350 may be exposed to the outside at the main surface 30b and be grounded. In this case, the ground electrodes 350 which are not exposed to the outside may be grounded as a result of being connected by using wiring patterns to the ground electrodes 350 which are grounded.

The material for the substrate 30 is not particularly restricted. In the first preferred embodiment, the dielectric layers defining the substrate 30 may be made of ceramic, for example, non-magnetic ferrite ceramic or alumina ceramic having alumina as the principal component. The material for the ground electrodes 350 and 351, the connecting terminals 320 through 322 and 340 through 342, and the wiring patterns 330 through 332 is not particularly restricted. In the first preferred embodiment, a metal or an alloy having copper as the principal component may be used.

As discussed above, the radio-frequency module 1 according to the first preferred embodiment includes the substrate 30 and the switch IC 20 mounted on the substrate 30 and including the common terminal 220 and the selection terminals 221 and 222. The substrate 30 includes the ground electrodes 350 and 351, which are electrodes to be grounded, located between the common terminal 220 and the selection terminals 221 and 222 in a plan view of the substrate 30.

With this configuration, at least a portion of radio-frequency waves propagating between the common terminal 220 and the selection terminals 221 and 222 of the switch IC 20 is able to be blocked. That is, it is possible to enhance the isolation between the common terminal 220 and the selection terminals 221 and 222 of the switch IC 20.

In the radio-frequency module 1, at least some of the ground electrodes 350 and 351 may be disposed within the substrate 30.

With this configuration, the ground electrodes 350 and 351 are able to block at least a portion of radio-frequency waves propagating within the substrate 30.

In the radio-frequency module 1, at least some of the ground electrodes 350 may extend in the thickness direction of the substrate 30.

With this configuration, radio-frequency waves propagating within the substrate 30 are able to be blocked more reliably by the ground electrodes 350.

In the radio-frequency module 1, the ground electrodes 350 may include a via-electrode extending in the thickness direction of the substrate 30.

In the radio-frequency module 1, the ground electrodes 350 may include plural via-electrodes aligned along the plural selection terminals 221 and 222 in a plan view of the substrate 30.

In this manner, the plural ground electrodes 350 with a columnar or substantially columnar shape are aligned between the common terminal 220 and the selection terminals 221 and 222. In other words, the plural ground electrodes 350 define a plane on which radio-frequency waves are able to be blocked. This makes it possible to more reliably block radio-frequency waves propagating between the common terminal 220 and the selection terminals 221 and 222.

In the radio-frequency module 1, the ground electrodes 351 may include a wiring pattern which connects at least two of the plural via-electrodes.

The ground electrodes 351 are electrodes including a wiring pattern extending in a direction parallel or substantially parallel with the main surface 30a of the substrate 30. Accordingly, the ground electrodes 351 contribute to blocking radio-frequency waves propagating within a portion of the substrate located between the plural ground electrodes 350 extending in the thickness direction of the substrate 30.

In the radio-frequency module 1, the substrate 30 may be a multilayer substrate including plural layers stacked on each other. The via-electrodes may pass through at least some of the plural layers defining the substrate 30.

In the radio-frequency module 1, the ground electrodes 350 and 351 may not be exposed to the outside at the main surface 30a of the substrate 30 on which the switch IC 20 is mounted.

With this configuration, it is possible to prevent the occurrence of short-circuiting on the main surface 30a between the ground electrodes 350 and 351 and the common terminal 220 and the selection terminals 221 and 222 of the switch IC 20. Additionally, since the ground electrodes 350 and 351 are not exposed at the main surface 30a, the diameter of the ground electrodes 350, for example, may be set to be equal or substantially equal to or greater than the distance between the common terminal 220 and the selection terminals 221 and 222. That is, the flexibility in choosing the sizes of the ground electrodes 350 and 351 is improved.

In the radio-frequency module 1, the substrate 30 may include the connecting terminal 340 connected to the common terminal 220. The connecting terminal 340 may be exposed to the outside at the main surface 30b on the opposite side of the main surface 30a on which the switch IC 20 is mounted.

As in the first preferred embodiment, if the connecting terminal 340, which is a conductive member, connected to the common terminal 220 of the switch IC 20 is exposed to the outside at the main surface 30b of the substrate 30, it means that a conductive member defining the connecting terminal 320, the wiring pattern 330, and the connecting terminal 340 extends from the main surface 30a to the main surface 30b. With this configuration, the conductive member is more likely to receive a radio-frequency signal propagating within the substrate 30. Accordingly, if the connecting terminal 340 is exposed to the outside at the main surface 30b, the effect of enhancing the isolation achieved by blocking radio-frequency waves propagating within the substrate 30 due to the provision of the ground electrodes 350 and 351 in the substrate 30 becomes more noticeable.

Second Preferred Embodiment

A radio-frequency module 2 according to a second preferred embodiment of the present invention will now be described below. The radio-frequency module 2 of the second preferred embodiment includes a directional coupler on a substrate. The radio-frequency module 2 will be described below mainly by referring to the points different from the radio-frequency module 1 of the first preferred embodiment.

The overall configuration of the radio-frequency module 2 will first be discussed below with reference to FIG. 5.

Figure 5:
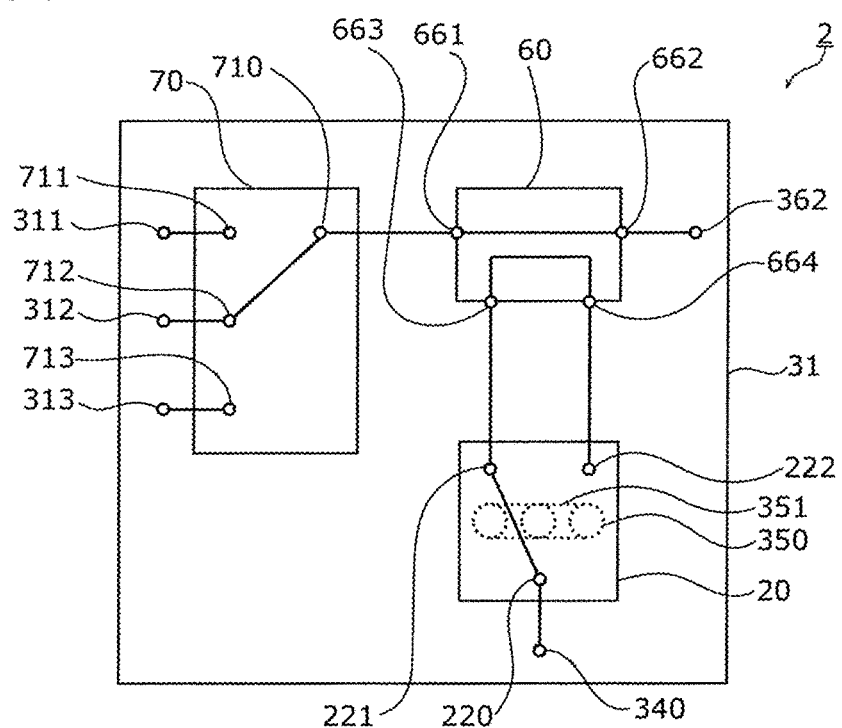
FIG. 5 is a circuit diagram illustrating the circuit configuration of a radio-frequency module according to a second preferred embodiment of the present invention.

FIG. 5 is a circuit diagram illustrating the circuit configuration of the radio-frequency module 2.

As shown in FIG. 5, as in the radio-frequency module 1 of the first preferred embodiment, the radio-frequency module 2 includes a substrate 31 and a switch IC 20. The radio-frequency module 2 also includes a directional coupler 60 and a switch IC 70.

The configuration of the substrate 31 is similar to that of the substrate 30 of the first preferred embodiment, except that the substrate 31 includes an area where the directional coupler 60 and the switch IC 70 are disposed on the main surface on which the switch IC 20 is mounted.

The directional coupler 60 is a coupler which outputs a portion of a radio-frequency signal propagating between input/output ports 661 and 662 to coupled ports 663 and 664. In the directional coupler 60, the coupled port to which a portion of a radio-frequency signal is output is different in accordance with the propagating direction of the radio-frequency signal. In the second preferred embodiment, a portion of a radio-frequency signal propagating from the input/output port 661 to the input/output port 662 is output to the coupled port 663, while portion of a radio-frequency signal propagating from the input/output port 662 to the input/output port 661 is output to the coupled port 664.

In the second preferred embodiment, the input/output ports 661 and 662 of the directional coupler 60 are respectively connected to the switch IC 70 and a connecting terminal 362. The coupled ports 663 and 664 of the directional coupler 60 are respectively connected to the selection terminals 221 and 222 of the switch IC 20.

The switch IC 70 is a switch circuit which selectively connects a common terminal 710 and one of plural selection terminals 711 through 713 with each other. The common terminal 710 is connected to the input/output port 661 of the directional coupler 60. The selection terminals 711 through 713 are respectively connected to connecting terminals 311 through 313 disposed on the substrate 31.

As in the radio-frequency module 1 of the first preferred embodiment, in the radio-frequency module 2 of the second preferred embodiment, the substrate 31 includes ground electrodes 350 and 351 which are located between the common terminal 220 and the plural selection terminals 221 and 222 of the switch IC 20 in a plan view of the substrate 31.

In the second preferred embodiment, as described above, the coupled ports 663 and 664 of the directional coupler 60 are respectively connected to the selection terminals 221 and 222 of the switch IC 20. Accordingly, a radio-frequency signal input into each of the selection terminals 221 and 222 is weaker than that propagating between the input/output ports 661 and 662 of the directional coupler 60. However, the isolation between the common terminal 220 and the selection terminals 221 and 222 of the switch IC 20 is enhanced. As a result, a weak radio-frequency signal output from the directional coupler 60 is able to be received by the common terminal 220 and be output at a high signal-to-noise (S/N) ratio.

In the example shown in FIG. 5, the selection terminals 221 and 222 of the switch IC 20 are respectively connected to the coupled ports 663 and 664 of the directional coupler 60. However, it is sufficient that at least one of the selection terminals 221 and 222 is connected to the corresponding one of the coupled ports 663 and 664. For example, if the selection terminal 221 is connected to the coupled port 663 and the selection terminal 222 is not connected to the coupled port 664, the coupled port 664 is able to be terminated outside the switch IC 20. Accordingly, radio-frequency noise propagating from the coupled port 664 to the switch IC 20 is merely negligible. On the other hand, if the coupled ports 663 and 664 are respectively connected to the selection terminals 221 and 222, it is not possible to terminate the coupled ports 663 and 664 outside the switch IC 20, which makes it difficult to significantly reduce or prevent the radiation of radio-frequency noise from the coupled ports 663 and 664. In the radio-frequency module 2 of the second preferred embodiment, even in such a case, the ground electrodes 350 and 351 are able to block radio-frequency waves radiated from the coupled port 663 or 664 connected to the selection terminal 221 or 222 which is not connected to the common terminal 220. Accordingly, the effect of blocking radio-frequency waves by the ground electrodes 350 and 351 in the radio-frequency module 2 becomes more noticeable when the selection terminals 221 and 222 are respectively connected to the coupled ports 663 and 664.

In the switch IC 70, as well as in the switch IC 20, in order to enhance the isolation between the common terminal 710 and the selection terminals 711 through 713, the substrate 31 may include ground electrodes which are located between the common terminal 710 and the selection terminals 711 through 713, in a plan view of the substrate 31.

An example of the application modes of the radio-frequency module 2 according to the second preferred embodiment will be described below with reference to FIG. 6.

Figure 6:
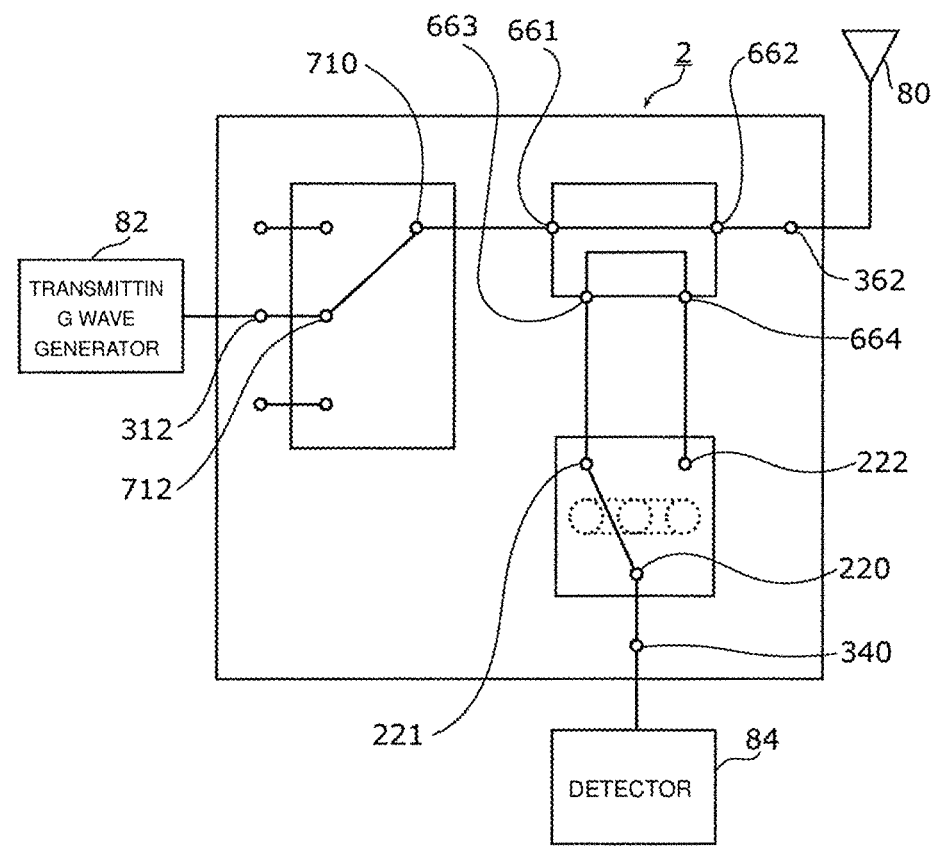
FIG. 6 is a circuit diagram illustrating an example of the application modes of the radio-frequency module according to the second preferred embodiment of the present invention.

FIG. 6 is a circuit diagram illustrating an example of the application modes of the radio-frequency module 2.

As shown in FIG. 6, the radio-frequency module 2 may be used in a state in which a transmitting wave generator 82, an antenna 80, and a detector 84 are connected to the radio-frequency module 2.

The antenna 80 is a device which radiates a radio-frequency signal as electromagnetic waves to a space and also receives electromagnetic waves propagating through a space. In this application mode, the antenna 80 is connected to the connecting terminal 362 connected to the input/output port 662 of the directional coupler 60.

The transmitting wave generator 82 is a device which generates a radio-frequency signal to be transmitted via the antenna 80. The output terminal of the transmitting wave generator 82 is connected to the connecting terminal 312 connected to the selection terminal 712 of the switch IC 70.

The detector 84 is a device which detects a radio-frequency signal output from the common terminal 220 of the switch IC 20.

In the application mode shown in FIG. 6, when the common terminal 220 is connected to the selection terminal 221 of the switch IC 20, a radio-frequency signal output from the coupled port 663 of the directional coupler 60 is input into the common terminal 220. That is, portion of a radio-frequency signal input into the directional coupler 60 (that is, portion of a radio-frequency signal to be input into the antenna 80) from the transmitting wave generator 82 is input into the common terminal 220 from the coupled port 663 via the selection terminal 221.

On the other hand, when the common terminal 220 is connected to the selection terminal 222 of the switch IC 20, a radio-frequency signal output from the coupled port 664 of the directional coupler 60 is input into the common terminal 220. That is, portion of a radio-frequency signal input into the antenna 80 from the directional coupler 60 and reflected by the antenna 80 is input into the common terminal 220 from the coupled port 664 via the selection terminal 222.

With the above-described configuration, in this application mode, a portion of a radio-frequency signal to be input into the antenna 80 is able to be detected by the detector 84, thus enabling the detector 84 to detect the intensity of a signal output from the transmitting wave generator 82. Additionally, in this application mode, a portion of a radio-frequency signal reflected by the antenna 80 is also to be detected by the detector 84. With this configuration, the standing wave ratio (SWR) in the antenna 80 is also to be detected.

In this application mode, a radio-frequency signal reflected by the antenna 80 may be weak. However, since the isolation between the common terminal 220 and the selection terminals 221 and 222 of the switch IC 20 is enhanced, the radio-frequency signal is able to be detected at a high S/N ratio.

As described above, the radio-frequency module 2 of the second preferred embodiment includes the directional coupler 60 in addition to the elements of the radio-frequency module 1 of the first preferred embodiment. At least one of the selection terminals 221 and 222 is connected to the corresponding coupled port 663 or 664 of the directional coupler 60.

If at least one of the selection terminals 221 and 222 is connected to the corresponding coupled port 663 or 664 of the directional coupler 60, a radio-frequency signal input into each of the selection terminals 221 and 222 is weaker than that propagating between the input/output ports 661 and 662 of the directional coupler 60. However, the isolation between the common terminal 220 and the selection terminals 221 and 222 of the switch IC 20 is enhanced. As a result, a weak radio-frequency signal output from the directional coupler 60 is able to be received by the common terminal 220 at a high S/N ratio.

In the radio-frequency module 2, the selection terminal 221 of the switch IC 20 is able to be connected to the coupled port 663 of the directional coupler 60, while the selection terminal 222 of the switch IC 20 may be connected to the coupled port 664 of the directional coupler 60.

In this manner, even if the coupled ports 663 and 664 are not terminated outside the directional coupler 60 and are instead respectively connected to the selection terminals 221 and 222, a weak radio-frequency signal from the directional coupler 60 is able to be received by the common terminal 220 at a high S/N ratio in the radio-frequency module 2.

Third Preferred Embodiment

A radio-frequency module 3 according to a third preferred embodiment of the present invention will be described below. In the third preferred embodiment, the radio-frequency module 3 includes another directional coupler in addition to the elements of the radio-frequency module 2 of the second preferred embodiment, and the number of selection terminals of each of the switch ICs is greater than that of the radio-frequency module 2 of the second preferred embodiment. The configuration of the radio-frequency module 3 and an example of the application modes will be discussed below with reference to FIG. 7.

Figure 7:
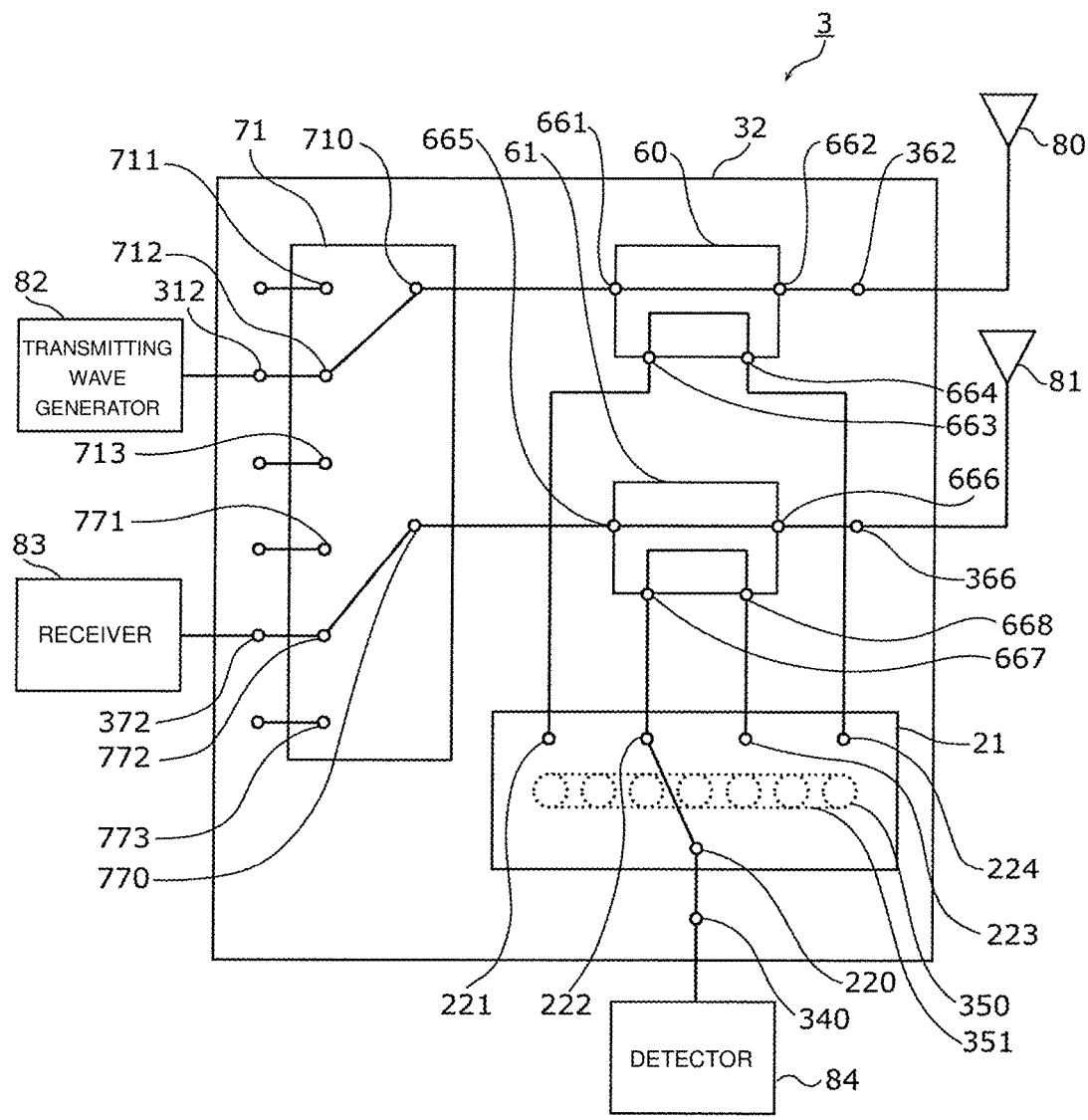
FIG. 7 is a circuit diagram illustrating the circuit configuration of a radio-frequency module according to a third preferred embodiment of the present invention and an example of the application modes thereof.

FIG. 7 is a circuit diagram illustrating the circuit configuration of the radio-frequency module 3 and an example of the application modes.

As in the radio-frequency module 2 of the second preferred embodiment, the radio-frequency module 3 includes a substrate 32, switch ICs 21 and 71, and a directional coupler 60, as shown in FIG. 7. In the third preferred embodiment, the radio-frequency module 3 also includes a directional coupler 61.

The switch IC 21 is different from the switch IC 20 of the second preferred embodiment in the number of selection terminals. The switch IC 21 includes selection terminals 223 and 224 in addition to the selection terminals 221 and 222.

The switch IC 71 includes two common terminals 710 and 770 and six selection terminals 711 through 713 and 771 through 773. The common terminal 710 is connected to one of the selection terminals 711 through 713, while the common terminal 770 is connected to one of the selection terminals 771 through 773.

The configuration of the directional coupler 61 is similar to that of the directional coupler 60. In the third preferred embodiment, input/output ports 665 and 666 of the directional coupler 61 are respectively connected to the common terminal 770 of the switch IC 71 and a connecting terminal 366. Coupled ports 667 and 668 of the directional coupler 61 are respectively connected to the selection terminals 222 and 223 of the switch IC 21.

In the third preferred embodiment, the coupled ports 663 and 664 of the directional coupler 60 are respectively connected to the selection terminals 221 and 224 of the switch IC 21.

The configuration of the substrate 32 is similar to that of the substrate 31 of the second preferred embodiment, except that the substrate 32 has an area where the directional coupler 61 is disposed on the main surface on which the switch IC 21 is mounted and that a greater number of ground electrodes 350 and 351 than that in the substrate 31 are provided because of the configuration of the switch IC 21.

In the radio-frequency module 3 of the third preferred embodiment, advantages similar to those obtained by the radio-frequency module 2 of the second preferred embodiment are also achieved.

An example of the application modes of the radio-frequency module 3 according to the third preferred embodiment will be described below with reference to FIG. 7.

As shown in FIG. 7, the radio-frequency module 3 may be used in a state in which a transmitting wave generator 82, a receiver 83, antennas 80 and 81, and a detector 84 are connected to the radio-frequency module 3.

The configuration of the antenna 81 is similar to that of the antenna 80. The antenna 81 may have a different resonant frequency from that of the antenna 80. In this application mode, the antenna 81 is connected to the connecting terminal 366 connected to the input/output port 666 of the directional coupler 61.

The receiver 83 is a device which receives a radio-frequency signal received by the antenna 81. In this application mode, a radio-frequency signal is input into the receiver 83 from the antenna 81 via a connecting terminal 372 connected to the selection terminal 772.

In this application mode, as well as that in the second preferred embodiment, a weak radio-frequency signal is input into each of the selection terminals 221 through 224 of the switch IC 21. Accordingly, in this application mode, advantages obtained by the radio-frequency module 2 are also achieved by the radio-frequency module 3.

Fourth Preferred Embodiment

A radio-frequency module 4 according to a fourth preferred embodiment of the present invention will be described below. In the fourth preferred embodiment, the region of a substrate is divided into sub-regions by ground electrodes. The radio-frequency module 4 of the fourth preferred embodiment will be discussed below with reference to FIG. 8.

Figure 8:
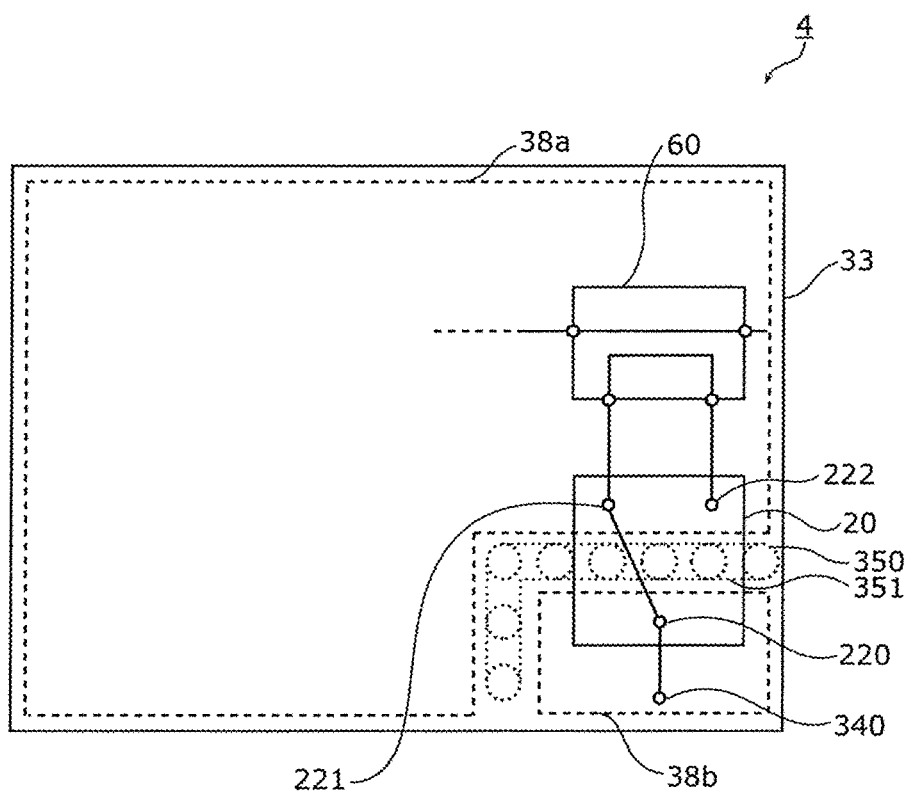
FIG. 8 is a circuit diagram illustrating the schematic configuration of a radio-frequency module according to a fourth preferred embodiment of the present invention.

FIG. 8 is a circuit diagram illustrating the schematic configuration of the radio-frequency module 4.

As in the radio-frequency module 1 of the first preferred embodiment, the radio-frequency module 4 includes a substrate 33 and a switch IC 20, as shown in FIG. 8. The radio-frequency module 4 is different from the radio-frequency module in that the region of the substrate 33 is divided into sub-regions by the ground electrodes 350 and 351. In this case, the region of the substrate 33 is divided into two sub-regions, namely, two sub-regions of the substrate 33 are separated from each other. This means that at least a set of the ground electrodes 350 and a set of the ground electrodes 351 are disposed along the entirety of the boundary line between the two sub-regions so that the propagation of a radio-frequency signal from one sub-region to the other sub-region is significantly reduced or prevented.

In the radio-frequency module 4, in a plan view of the substrate 33, the ground electrodes 350 and 351 separate a sub-region 38b at a corner of the substrate 33 where the common terminal 220 is disposed from a sub-region 38a where the selection terminals 221 and 222 and the directional coupler 60 are disposed.

With this configuration, even in a case in which a radio-frequency device that radiates radio-frequency waves other than the directional coupler 60 is disposed around the switch IC 20 in the sub-region 38a, the propagation of the radio-frequency waves to the sub-region 38b is able to be blocked by the ground electrodes 350 and 351, thus significantly reducing or preventing the occurrence of radio-frequency noise in the sub-region 38b. As a result, a decrease in the S/N ratio of a radio-frequency signal output from the common terminal 220 is able to prevented.

The sub-region 38b is located at a corner of the substrate 33. This makes it possible to facilitate inputting of a radio-frequency signal output from the common terminal 220 into a detector located outside the radio-frequency module 4 via the connecting terminal 340. It is also possible to decrease the number of ground electrodes 350 and 351 that are necessary to separate the sub-regions 38a and 38b from each other, which also makes it possible to reduce the area where the ground electrodes 350 and 351 are disposed. The corner of the substrate 33 refers to an area which contacts two edge portions of the substrate 33 extending in directions intersecting with each other. The two edge portions may not have to be linear portions but may be curved portions.

Preferably, elements other than the common terminal 220, for example, elements that radiate radio-frequency waves, are not disposed in the sub-region 38b. This makes it possible to more effectively reduce or prevent the occurrence of radio-frequency noise in the sub-region 38b.

Modified Examples

The radio-frequency modules according to the preferred embodiments of the present invention have been discussed. However, these radio-frequency modules are only examples. The elements in the above-described preferred embodiments may be combined in any manner to realize other preferred embodiments, and various modifications apparent to those skilled in the art may be made to the preferred embodiments without departing from the scope and spirit of the present invention. Such preferred embodiments and modified examples are also encompassed within the present invention. Additionally, various devices integrating the radio-frequency module of one of the preferred embodiments therein are also encompassed within the present invention.

In the above-described preferred embodiments, as the ground electrodes, the ground electrodes 350 defined by via-electrodes and the ground electrodes 351 defined by wiring patterns are used. However, the configuration of the ground electrodes is not restricted to this. For example, only the ground electrodes 350 defined by via-electrodes may be used, or only the ground electrodes 351 defined by wiring patterns may be used.

In the first preferred embodiment, the connecting terminal 340 connected to the common terminal 220 is exposed to the outside at the main surface 30b on the opposite side of the main surface 30a of the substrate 30 on which the switch IC 20 is mounted. However, instead of the connecting terminal 340, the connecting terminals 341 and 342 connected to the selection terminals 221 and 222, respectively, may be exposed to the outside at the main surface 30b. Alternatively, all the connecting terminals 340, 341, and 342 respectively connected to the common terminal 220 and the selection terminals 221 and 222 may be exposed to the outside at the main surface 30b or may be exposed to the outside at the main surface 30a.

In the radio-frequency modules of the above-described preferred embodiments, other radio-frequency circuit elements and wirings may be inserted on paths that connect the radio-frequency circuit elements and signal paths shown in the drawings.

Preferred embodiments of the present invention are widely applicable to communication devices, such as cellular phones, as a radio-frequency module connected to an antenna from which a radio-frequency signal is transmitted.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency module comprising:
   a substrate including a first main surface, a second main surface opposed to the first main surface, and a plurality of layers stacked on each other between the first main surface and the second main surface; and
   a circuit component mounted on the substrate, the circuit component including a first switch and a plurality of bumps disposed on the first main surface of the substrate; wherein
   the plurality of bumps include:
      a first bump defining a common terminal of the first switch;
      a second bump defining a first selection terminal of the first switch; and
      a third bump defining a second selection terminal of the first switch;
   the first selection terminal and the common terminal are connectable with each other through the first switch;
   the second selection terminal and the common terminal are connectable with each other through the first switch;
   the multilayer substrate further includes a first ground electrode;
   the first ground electrode is disposed between the common terminal and the first selection terminal and/or is disposed between the common terminal and the second selection terminal in a plan view of the substrate; and
   the first ground electrode is not exposed from the first main surface of the substrate.

2. The radio-frequency module according to claim 1, wherein the first ground electrode includes at least one via-electrode passing through at least one of the plurality of layers.

3. The radio-frequency module according to claim 1, wherein at least a portion of the first ground electrode extends in a thickness direction of the substrate.

4. The radio-frequency module according to claim 1, wherein a distance between the common terminal and the first selection terminals is about 50 μm to about 150 μm.

5. The radio-frequency module according to claim 1, wherein the first ground electrode includes a plurality of via-electrodes that are disposed adjacent to the first and second selection terminals in the plan view of the substrate such that the plurality of via-electrodes are aligned along the first and second selection terminals in the plan view of the substrate.

6. The radio-frequency module according to claim 1, wherein the first ground electrode includes a plurality of via-electrodes and a wiring pattern which connects at least two of the plurality of via-electrodes.

7. The radio-frequency module according to claim 6, wherein a distance between at least two of the plurality of the via-electrodes is about ¼ or less than a wavelength of waves used in the radio-frequency module.

8. The radio-frequency module according to claim 6, wherein a diameter of the first ground electrode is equal or substantially equal to or greater than a distance between the common terminal and the first selection terminal.

9. The radio-frequency module according to claim 1, further comprising:
   a directional coupler; wherein
   at least one of the first selection terminal and the second selection terminal is connected to a coupled port of the directional coupler.

10. The radio-frequency module according to claim 9, wherein another one of the first selection terminal and the second selection terminal is connected to another coupled port of the directional coupler.

11. The radio-frequency module according to claim 10, wherein, in the plan view of the substrate, the first ground electrode separates a region at a corner of the substrate where the common terminal is disposed, from a region of the substrate where the first selection terminal, the second selection terminal, and the directional coupler are disposed.

12. The radio-frequency module according to claim 1, wherein
   the first switch includes a field-effect transistor; and
   the circuit component is a packaged circuit component.

13. The radio-frequency module according to claim 1, further comprising connecting terminals disposed on the substrate at positions that are aligned with positions of the common terminal and the first and second selection terminals in the plan view of the substrate.

14. The radio-frequency module according to claim 13, wherein a conductive member defines at least two of the connecting terminals and a wiring pattern, and extends from the first main surface to the second main surface of the substrate.

15. The radio-frequency module according to claim 1, wherein the first ground electrode has one of a columnar shape, a substantially columnar shape, a cylindrical shape, a substantially cylindrical, a plate shape, a substantially plate shape, a rectangular parallelepiped shape, and a substantially rectangular parallelepiped shape.

16. A radio-frequency module comprising:

a substrate including a first main surface, a second main surface opposed to the first main surface, and a plurality of layers stacked on each other between the first main surface and the second main surface; and a circuit component mounted on the substrate, the circuit component including a first switch and a plurality of bumps on the first main surface of the substrate; wherein the plurality of bumps include:

a first bump defining a common terminal of the first switch;

a second bump defining a first selection terminal of the first switch; and a third bump defining a second selection terminal of the first switch;

the first selection terminal and the common terminal are connectable with each other through the first switch;

the second selection terminal and the common terminal are connectable with each other through the first switch;

the multilayer substrate further includes a first ground electrode, a second ground electrode, and a wiring pattern connecting the first ground electrode and the second ground electrode;

at least a portion of the wiring pattern is disposed between the common terminal and the first selection terminal and/or is disposed between the common terminal and the second selection terminal in a plan view of the substrate; and at least one of the first ground electrode and the second ground electrode is not exposed from the first main surface of the substrate.

17. The radio-frequency module according to claim 16, wherein the first ground electrode and the second ground electrode include at least one via-electrode passing through at least one of the plurality of layers.

18. The radio-frequency module according to claim 17, wherein a distance between the common terminal and the first selection terminal is about 50 μm to about 150 μm.

19. The radio-frequency module according to claim 16, wherein the first ground electrode and the second ground electrode are not exposed from the first main surface of the substrate.

* * * * *